(12) United States Patent
Bell

(10) Patent No.: US 7,231,772 B2
(45) Date of Patent: Jun. 19, 2007

(54) COMPACT, HIGH-EFFICIENCY THERMOELECTRIC SYSTEMS

(75) Inventor: Lon E. Bell, Altadena, CA (US)

(73) Assignee: BSST LLC., Irwindale, CA (US)

( * ) Notice: Subject to any disclaimer, the term of this patent is extended or adjusted under 35 U.S.C. 154(b) by 285 days.

(21) Appl. No.: 10/227,398

(22) Filed: Aug. 23, 2002

(65) Prior Publication Data

US 2003/0005706 A1 Jan. 9, 2003

Related U.S. Application Data

(63) Continuation-in-part of application No. 09/844,818, filed on Apr. 27, 2001, now Pat. No. 6,539,725.

(60) Provisional application No. 60/267,657, filed on Feb. 9, 2001.

(51) Int. Cl.
F25B 21/02 (2006.01)

(52) U.S. Cl. ............... 62/3.7; 62/3.6; 62/259.2

(58) Field of Classification Search ............... 62/3.3, 62/3.2, 259.2, 3.7; 165/80.3
See application file for complete search history.

(56) References Cited

U.S. PATENT DOCUMENTS

| | | |
|---|---|---|
| 2,944,404 A | 7/1960 | Fritts |
| 2,949,014 A | 8/1960 | Belton, Jr. et al. |
| 3,004,393 A | 10/1961 | Alsing |
| 3,006,979 A | 10/1961 | Rich |
| 3,071,495 A | 1/1963 | Hänlein |
| 3,126,116 A | 3/1964 | Clinehens |
| 3,129,116 A | 4/1964 | Corry |
| 3,178,895 A | 4/1965 | Mole et al. |
| 3,213,630 A | 10/1965 | Mole |
| 3,527,621 A | 9/1970 | Newton |
| 3,607,444 A | 9/1971 | DeBucs |
| 3,626,704 A | 12/1971 | Coe, Jr. |
| 3,635,037 A | 1/1972 | Hubert |
| 3,663,307 A * | 5/1972 | Mole .................. 136/204 |
| 3,681,929 A | 8/1972 | Schering |
| 3,779,814 A | 12/1973 | Miles et al. |

(Continued)

FOREIGN PATENT DOCUMENTS

DE 43 29 816 3/1994

(Continued)

OTHER PUBLICATIONS

A New Concept of Porous Thermoelectric Module a Reciprocating Flow for Cooling/Heating System (Numerical Analysis for Heating System), Shigeru Tada, Ryozo Echigo and Hideo Yoshida, 16th International Conference on Thermoelectrics (1997).

(Continued)

Primary Examiner—Melvin Jones
(74) Attorney, Agent, or Firm—Knobbe Martens Olson & Bear LLP

(57) ABSTRACT

A number of compact, high-efficiency thermoelectric system utilizing the advantages of thermal isolation in the direction of a working medium flow or movement, in manufacturable systems, are described. Such configurations exhibit high system efficiency and power density. Several different embodiments and applications are disclosed utilizing a plurality of thermoelectric modules or thermoelectric elements sandwiched between heat exchangers.

13 Claims, 13 Drawing Sheets

U.S. PATENT DOCUMENTS

| | | | |
|---|---|---|---|
| 3,817,043 A | 6/1974 | Zoleta | |
| 4,038,831 A | 8/1977 | Gaudel et al. | |
| 4,065,936 A | 1/1978 | Fenton et al. | |
| 4,281,516 A * | 8/1981 | Berthet et al. | 62/3 |
| 4,297,841 A | 11/1981 | Cheng | |
| 4,420,940 A | 12/1983 | Buffet | |
| 4,494,380 A * | 1/1985 | Cross | 62/3 |
| 4,499,329 A | 2/1985 | Benicourt et al. | |
| 4,730,459 A * | 3/1988 | Schlicklin et al. | 62/3.7 |
| 4,731,338 A | 3/1988 | Ralston et al. | |
| 4,905,475 A | 3/1990 | Tuomi | |
| 4,989,626 A * | 2/1991 | Takagi et al. | 137/13 |
| 5,038,569 A | 8/1991 | Shirota et al. | |
| 5,092,129 A | 3/1992 | Bayes et al. | |
| 5,097,829 A | 3/1992 | Quisenberry | |
| 5,193,347 A | 3/1993 | Apisdorf | |
| 5,228,923 A | 7/1993 | Hed | |
| 5,232,516 A * | 8/1993 | Hed | 136/204 |
| 5,385,020 A | 1/1995 | Gwilliam et al. | |
| 5,429,680 A | 7/1995 | Fuschetti | |
| 5,499,504 A | 3/1996 | Mill et al. | |
| 5,584,183 A | 12/1996 | Wright et al. | |
| 5,592,363 A | 1/1997 | Atarashi et al. | |
| 5,605,047 A | 2/1997 | Park et al. | |
| 5,682,748 A | 11/1997 | De Vilbiss et al. | |
| 5,802,856 A * | 9/1998 | Schaper et al. | 62/3.7 |
| 5,860,472 A * | 1/1999 | Batchelder | 165/185 |
| 5,867,990 A | 2/1999 | Ghoshal | |
| 5,900,071 A | 5/1999 | Harman | |
| RE36,242 E | 6/1999 | Apisdorf | |
| 5,921,088 A | 7/1999 | Imaizumi et al. | |
| 5,966,941 A | 10/1999 | Ghoshal | |
| 5,987,890 A | 11/1999 | Chiu et al. | |
| 6,000,225 A | 12/1999 | Ghoshal | |
| 6,082,445 A * | 7/2000 | Dugan | 165/167 |
| 6,084,172 A | 7/2000 | Kishi et al. | |
| 6,096,966 A | 8/2000 | Nishimoto et al. | |
| 6,282,907 B1 | 9/2001 | Ghoshal | |
| 6,319,744 B1 | 11/2001 | Hoon et al. | |
| 6,334,311 B1 | 1/2002 | Kim et al. | |
| 6,346,668 B1 | 2/2002 | McGrew | |
| 6,347,521 B1 | 2/2002 | Kadotani et al. | |
| 6,359,725 B1 | 3/2002 | Islam | |
| 6,366,832 B2 | 4/2002 | Lomonaco et al. | |
| 6,367,261 B1 | 4/2002 | Marshall et al. | |
| 6,401,462 B1 | 6/2002 | Bielinski | |
| 6,412,287 B1 | 7/2002 | Hughes et al. | |
| 6,446,442 B1 * | 9/2002 | Batchelor et al. | 62/3.3 |
| 6,477,844 B2 | 11/2002 | Ohkubo et al. | |
| 6,481,213 B2 | 11/2002 | Carr et al. | |
| 6,510,696 B2 | 1/2003 | Guttman et al. | |
| 6,530,231 B1 | 3/2003 | Nagy et al. | |
| 6,530,842 B1 | 3/2003 | Wells et al. | |
| 6,539,725 B2 | 4/2003 | Bell | |
| 6,560,968 B2 | 5/2003 | Ko | |
| RE38,128 E | 6/2003 | Gallup et al. | |
| 6,598,405 B2 * | 7/2003 | Bell | 62/3.3 |
| 6,625,990 B2 | 9/2003 | Bell | |
| 6,637,210 B2 | 10/2003 | Bell | |
| 6,672,076 B2 | 1/2004 | Bell | |
| 6,812,395 B2 | 11/2004 | Bell | |
| 2002/0014261 A1 | 2/2002 | Caillat et al. | |
| 2002/0139123 A1 | 10/2002 | Bell | |
| 2002/0148234 A1 | 10/2002 | Bell | |
| 2003/0079770 A1 | 5/2003 | Bell | |
| 2003/0094265 A1 | 5/2003 | Chu et al. | |

FOREIGN PATENT DOCUMENTS

| | | | |
|---|---|---|---|
| EP | 02 72 937 | | 12/2003 |
| GB | 817 077 A | | 7/1959 |
| GB | 2 027 534 | | 2/1980 |
| GB | 2267338 | | 12/1993 |
| JP | 56-18231 | | 2/1981 |
| JP | 4 165234 | | 6/1992 |
| JP | 5-219765 | | 8/1993 |
| JP | 07253264 | | 2/1996 |
| JP | 09042801 | | 2/1997 |
| JP | 2001-24240 | * | 7/1999 |
| SE | 329 870 | | 5/1969 |
| SE | 337 227 | | 8/1971 |
| US | PCT/US02/03772 | | 7/2002 |
| US | PCT/US02/03772 | | 8/2002 |
| US | PCT/US03/24899 | | 8/2003 |
| US | PCT/US03/24899 | | 3/2004 |
| US | PCT/US04/026560 | | 6/2004 |
| US | PCT/US2004/026757 | | 3/2005 |
| WO | WO 02/065030 A1 | | 8/2002 |

OTHER PUBLICATIONS

International Search Report for PCT/US 02/03654 dated Jun. 12, 2002.

H.J. Goldsmid, *Electronic Refrigeration*, Pion Ltd, 207 Brondesbury Park, London (1986).

Stanley W. Angrist, *Direct Energy Conversion*, 32 Ed. Ally & Bacon (1976).

International Search Report for PCT/US 02/06285 dated Jun. 12, 2002.

A New Concept for Improving Thermoelectric Heat Pump Efficiency, R.J. Buist, J.W. Fenton and J.S. Lee, Borg-Warner Thermoelectrics Wolf and Algonquin Road.

U.S. Appl. No. 10/405,001, filed Mar. 31, 2003, Bell.

U.S. Appl. No. 10/642,773, filed Aug. 18, 2003, Bell.

U.S. Appl. No. 10/897,292, filed Jul. 22, 2004, Bell.

U.S. Appl. No. 10/642,980, filed Aug. 18, 2003, Bell.

U.S. Appl. No. 11/023,294, filed Dec. 27, 2004, Bell.

U.S. Appl. No. 11/136,334, filed May 24, 2005, Bell.

Bell, L.E., "Use of Thermal Isolation to Improve Thermoelectric System Operating Efficiency," Proc. 21st Int'l Conf. on Thermoelectrics, Long Beach, CA, Aug. 2002.

Bell, L.E., "Increased Thermoelectric System Thermodynamic Efficiency by Use of Convective Heat Transport," Proc. 21st Int'l Conf. on Thermoelectrics, Long Beach, CA, Aug. 2002.

*CRC Handbook of Thermoelectrics*, ed. D.M. Rowe, Chapter 54, *Medium-Scale Cooling: Thermoelectric Module Technology*, Jul. 1995, ISBN: 0-8493-0146-7.

Diller, R.W., et al., "Experimental Results Confirming Improved Efficiency of Thermoelectric Power Generation Systems with Alternate Thermodynamie Cycles," 22$^{nd}$ International Conference on Thermoelectrics, 2003, pp. 571-573.

International Search Report for PCT/US 02/03659 dated Jul. 9, 2002.

International Search Report for PCT/US 02/25233 dated Sep. 24, 2002.

International Search Report for PCT/US 03/17834 dated Jul. 29, 2003.

Miner, A., Majumdar, A., and U. Ghoshal, Thermo-Electro-Mechanical Refrigeration Based on Transient Thermoelectric Effects, Applied Physics letters, vol. 75, pp. 1176-1178 (1999).

Buist, R. and Lau, P., Theoretical Analysis of Thermoelectric Cooling Performance Enhancement Via Thermal and Electrical Pulsing, Journal of Thermoelectricity, No. 4, 1996.

U.S. Appl. No. 09/844,818, filed Apr. 27, 2001, and pending claims.

U.S. Appl. No. 10/227,398, filed Aug. 23, 2002, and pending claims.

U.S. Appl. No. 09/860,725, filed May 18, 2001, and pending claims.

U.S. Appl. No. 10/632,235, filed Jul. 31, 2003, and pending claims.

U.S. Appl. No. 09/918,999, filed Jul. 31, 2001, and pending claims.

U.S. Appl. No. 10/215,613, filed Aug. 7, 2002, and pending claims.
U.S. Appl. No. 09/987,232, filed Nov. 6, 2001, and pending claims.
U.S. Appl. No. 10/074,543, filed Feb. 11, 2002, and pending claims.
U.S. Appl. No. 10/164,656, filed Jun. 6, 2002, and pending claims.
Bell, L.E., "Use of Thermal Isolation to Improve Thermoelectric System Operating Efficiency," Proc. 21st Int'l. Conf. on Thermoelectrics, Long Beach, CA, Aug. 2002.

Bell, L.E., "Increased Thermoelectric System Thermodynamic Efficiency by Use of Convective Heat Transport,"Proc. 21st Int'l. Conf. on Thermoelectrics, Long Beach, CA, Aug. 2002.

*CRC Handbook of Thermoelectrics*, ed. D.M. Rowe, Chapter 54, "Medium-Scale Cooling: Thermoelectric Module Technology," Jul. 1995, ISBN: 0-8493-0146-7.

* cited by examiner

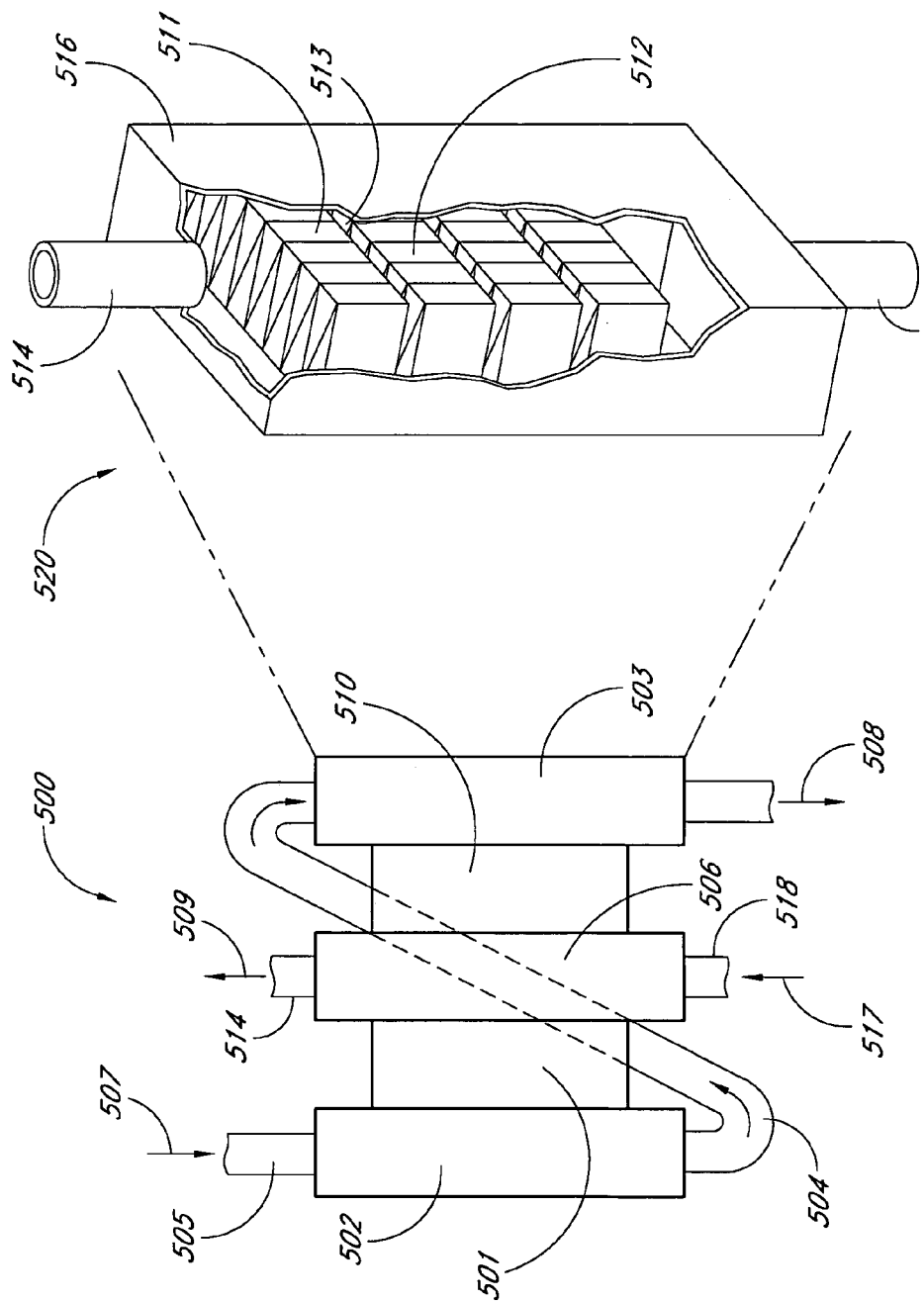

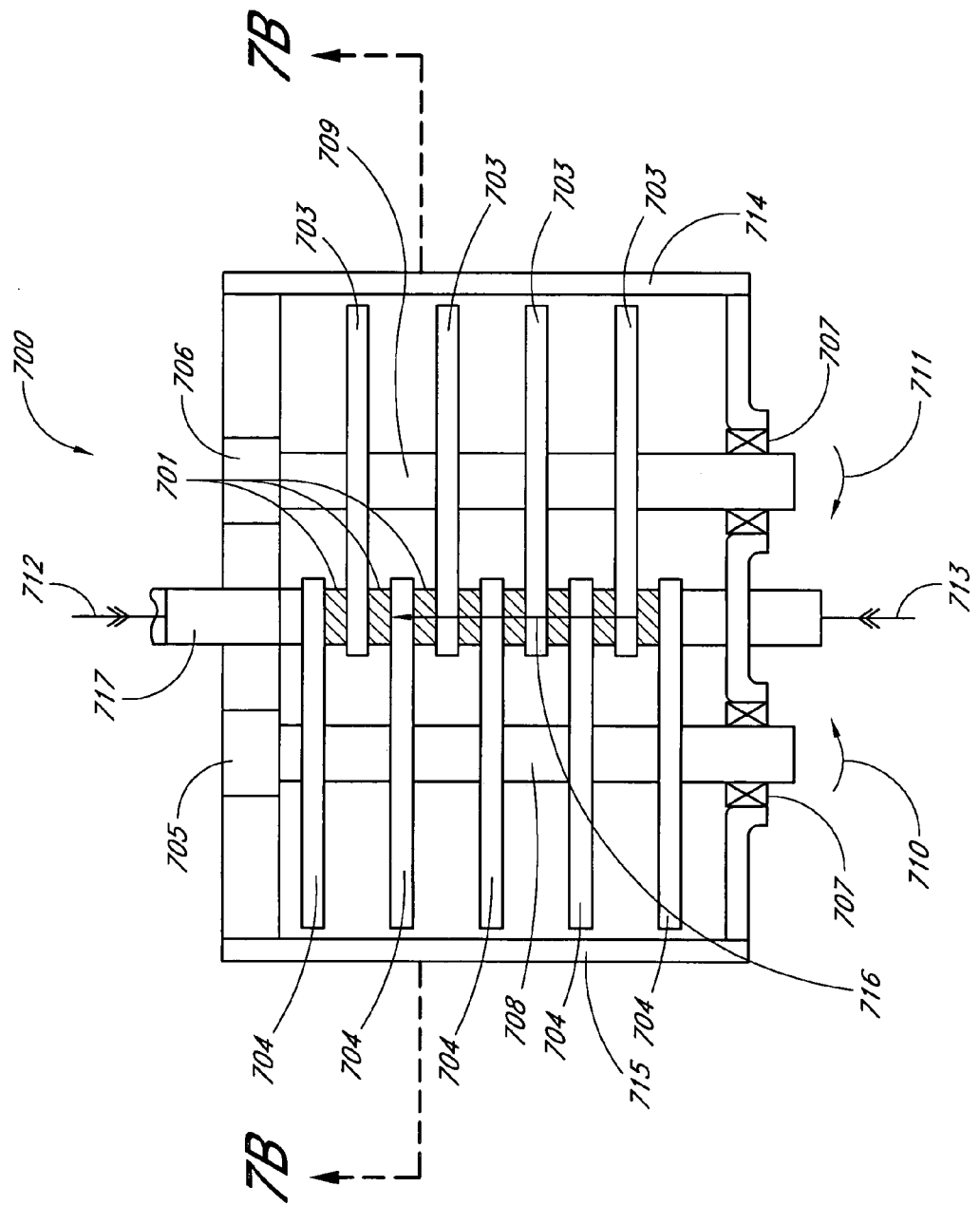

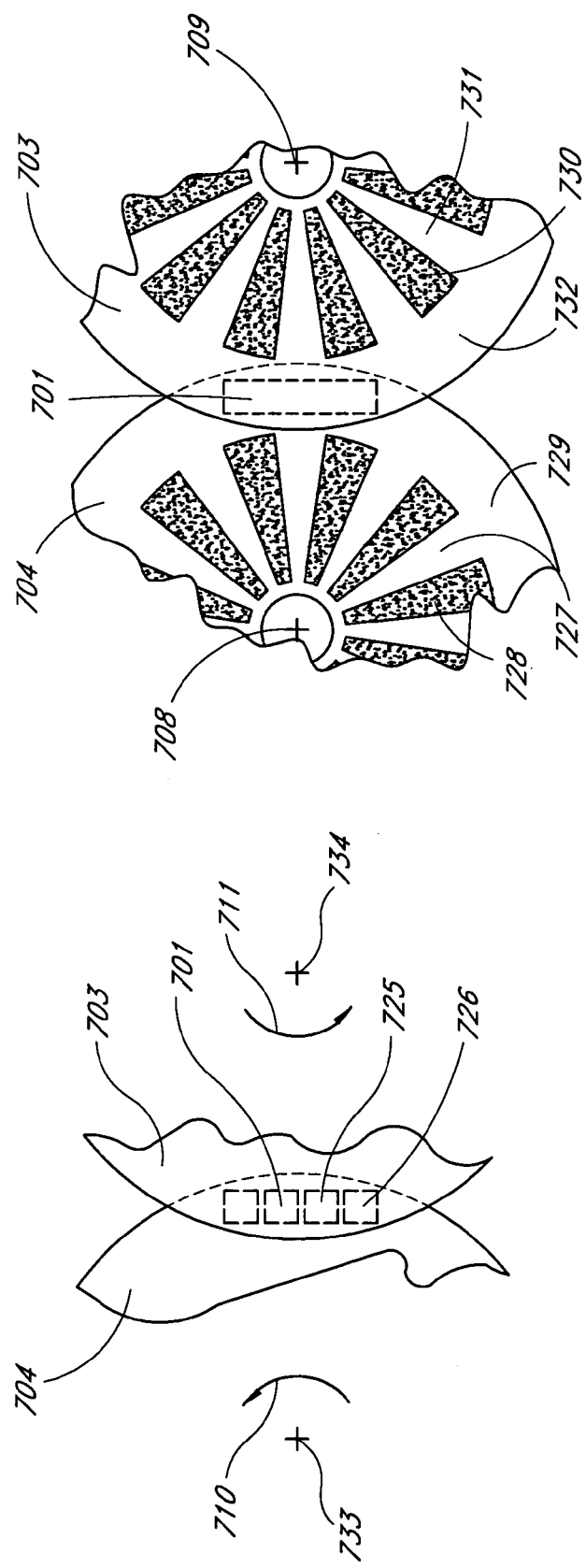

COMPACT, HIGH-EFFICIENCY THERMOELECTRIC SYSTEMS

CONTINUING APPLICATION DATA

This application is a continuation in part of U.S. patent application Ser. No. 09/844,818, filed Apr. 27, 2001 now U.S. Pat. No. 6,539,725, which is related to and claims the benefit of U.S. Provisional Patent Application No. 60/267,657 filed Feb. 9, 2001.

BACKGROUND OF THE INVENTION

1. Field of the Invention

This disclosure relates to improved configurations for solid-state cooling, heating and power generation systems.

2. Description of the Related Art

Thermoelectric devices (TEs) utilize the properties of certain materials to develop a temperature gradient across the material in the presence of current flow. Conventional thermoelectric devices utilize P-type and N-type semiconductors as the thermoelectric material within the device. These are physically and electrically configured in such a manner that the desired function of heating or cooling is obtained.

The most common configuration used in thermal electric devices today is illustrated in FIG. 1. Generally, P-type and N-type thermal electric elements 102 are arrayed in a rectangular assembly 100 between two substrates 104. A current, I, passes through both element types. The elements are connected in series via copper shunts 106 saddled to the ends of the elements 102. A DC voltage 108, when applied, creates a temperature gradient across the TE elements. TEs are commonly used to cool liquids, gases and objects.

Solid-state cooling, heating and power generation (SSCHP) systems have been in use since the 1960's for military and aerospace instrumentation, temperature control and power generation applications. Commercial usage has been limited because such systems have been too costly for the function performed, and have low power density so SSCHP systems are larger, more costly, less efficient and heavier than has been commercially acceptable.

Recent material improvements offer the promise of increased efficiency and power densities up to one hundred times those of present systems.

SUMMARY OF THE INVENTION

Efficiency gains for geometries described in co-pending patent application Ser. No. 09/844,818 entitled Improved Efficiency Thermoelectrics Utilizing Thermal Isolation, yield an additional 50% to 100% improvement for many important applications. Combined with the material improvements being made, system efficiency gains of a factor of four or more are possible. The prospects of these substantial improvements have lead to renewed interest in the technology and the effort to develop SSCHP systems for new applications.

In general, this disclosure describes a new family of SSCHP configurations. These configurations achieve compact, high-efficiency energy conversion and can be relatively low cost. Generally, several embodiments are disclosed wherein thermoelectric elements or modules or are sandwiched between heat exchangers. The thermoelectric modules are advantageously oriented such that for any two modules sandwiching a heat exchanger, the same temperature type side faces the heat exchanger. For example, the cooler side of each of the thermoelectric sandwiching a heat exchanger face the same heat exchanger, and thus each other. Preferably, at least one working medium is passed sequentially through at least two heat exchangers so that the cooling or heating provided is additive on the working medium. This configuration has the added benefit that it utilizes the advantages of thermal isolation, as described in U.S. patent application Ser. No. 09/844,818, in manufactureable systems that exhibit high system efficiency and power density as noted in the references above. As explained in that application, in general, a thermoelectric device achieves increased or improved efficiency by subdividing the overall assembly of thermoelectric elements into thermally isolated subassemblies or sections. For example, the heat exchangers may be subdivided so as to provide thermal isolation in the direction of working medium flow. For example, a thermoelectric system has a plurality of thermoelectric elements forming a thermoelectric array with a cooling side and a heating side, wherein the plurality of thermoelectric elements are substantially isolated from each other in at least one direction across the array. Preferably, the thermal isolation is in the direction of the working media flow. This thermal isolation can be provided by having a heat exchanger configured in sections such that the heat exchanger has portions which are thermally isolated in the direction of working fluid flow.

In the present disclosure, having sequential use of heat exchangers of the same temperature type for the working fluid provides a type of thermal isolation in itself. In addition, the heat exchangers or the TE elements, or portions of TE elements or any combination may be configured to provide thermal isolation in the direction of the working fluid flow over and above the thermal isolation provided by having a series or sequence of heat exchangers through which at least one working fluid passes in sequence.

The principles disclosed for cooling and/or heating applications, are equally applicable to power generation application. The system may be tuned in a manner to maximize the efficiency for the given application, but the general principles apply.

The particular embodiments described in this application lower the construction complexity and cost of SSCHP devices while still maintaining or improving efficiency gains from thermal isolation.

A first aspect of the present disclosure involves an improved thermoelectric system having a plurality of thermoelectric modules, at least some of which are substantially thermally isolated from each other, each module having a hotter side and a colder side. At least one solid working medium is in thermal communication with at least two of the plurality of thermoelectric modules in sequence, such that the working medium is progressively cooled or heated in stages by at least two of the thermoelectric modules.

In one preferred embodiment, the working medium comprises a plurality of disk-like media mounted to a rotating shaft, and the media form a stacked configuration with the thermoelectric modules sandwiching at least some of the disk-like media. Advantageously, the working medium may comprise a plurality of working media forming an alternating stacked configuration of thermoelectric modules and working media. Preferably, the working media substantially thermally isolates at least some of the plurality of thermoelectric modules.

Another aspect of the present invention involves an improved thermoelectric system having a plurality of thermoelectric modules, at least some of which are substantially thermally isolated from each other, each module having a hotter side and a colder side. A plurality of heat transfer devices, each in thermal communication with at least one of the plurality of thermoelectric modules are also provide, wherein at least two of the heat transfer devices accept a first working fluid that travels through the heat transfer devices. At least one conduit couples the at least two of the heat transfer devices in different planes, such that the first working fluid moves through a first of the at least two heat transfer devices and sequentially through a second of the at least two heat transfer devices, and is cooled or heated in stages as it passes through the at least two heat transfer devices.

In one embodiment, each of at least some of the heat transfer devices is sandwiched between at least two thermoelectric modules. In addition, preferably, at least two thermoelectric modules have the cooler side facing the sandwiched heat transfer device.

In one embodiment, the thermoelectric modules and heat transfer devices form a stack, with cooler sides facing cooler sides, separated by at least one heat transfer device, and hotter sides facing hotter side, separated by at least one heat transfer device.

In one embodiment, the heat transfer devices are heat exchangers comprising a housing and heat exchanger fins, the heat exchanger fins forming stages in the direction of the working fluid flow, so as to provide additional thermal isolation for at least one of the thermoelectric modules in thermal communication with the heat exchanger. Preferably, at least one conduit is configured such that working fluid flows through the at least two heat transfer devices couple by the conduit flows in the same direction.

Yet another aspect of the present invention involves a thermoelectric system having a plurality of N-type thermoelectric elements and a plurality of P-type thermoelectric elements. A plurality of heat transfer devices, at least some of which are each sandwiched between at least one of the N-type thermoelectric elements and at least one of the P-type thermoelectric elements, are provided so as to form a stacked configuration of thermoelectric elements and heat transfer devices. In one embodiment, the system further has a current source electrically coupled to the stack, the drive current traversing through the heat transfer devices and thermoelectric elements in series. Preferably, the heat transfer devices thermally isolate at least some of the P-type thermoelectric elements from at least some of the N-type thermoelectric elements. Advantageously, the heat transfer devices accept a working fluid to flow through them in a defined direction In one embodiment, the heat transfer devices are heat exchangers comprising a housing with heat exchanger elements inside formed in segments, and wherein at least one of the segments is substantially thermally isolated from at least one other of the segments.

In one embodiment, the at least one conduit provides a fluid path from a first heat exchanger to a second heat exchanger, such that working fluid travelling through the first heat exchanger and the second heat exchanger is cooled or heated in stages.

These and other aspects and embodiments of the present invention are described in more detail in conjunction with the Figures.

BRIEF DESCRIPTION OF THE DRAWINGS

FIG. 5 depicts a system with two TE modules, segmented heat exchanger to achieve thermal isolation and counter flow of the liquid media.

DETAILED DESCRIPTION OF THE PREFERRED EMBODIMENT

In the context of this description, the term thermoelectric module or TE module are used in the broad sense of their ordinary and accustomed meaning, which is (1) conventional thermoelectric modules, such as those produced by Hi Z Technologies, Inc. of San Diego, Calif., (2) quantum tunneling converters, (3) thermoionic modules, (4) magneto caloric modules, (5) elements utilizing one, or any combination of thermoelectric, magneto caloric, quantum, tunneling and thermoionic effects, (6) any combination, array, assembly and other structure of (1) through (6) above. The term thermoelectric element, is more specific to indicate individual element that operate using thermoelectric, thermoionic, quantum, tunneling, and any combination of these effects In the following descriptions, thermoelectric or SSCHP systems are described by way of example. Nevertheless, it is intended that such technology and descriptions encompass all SSCHP systems.

Accordingly, the invention is introduced by using examples in particular embodiments for descriptive and illustrative purposes. A variety of examples described below illustrate various configurations and may be employed to achieve the desired improvements. In accordance with the present description, the particular embodiments and examples are only illustrative and not intended in any way to restrict the inventions presented. In addition, it should be understood that the terms cooling side, heating side, cold side, hot side, cooler side and hotter side and the like, do not indicate any particular temperature, but are relative terms. For example, the "hot," side of a thermoelectric element or array or module may be at ambient temperature with the "cold," side at a cooler temperature than the ambient. The converse may also be true. Thus, the terms are relative to each other to indicate that one side of the thermoelectric is at a higher or lower temperature than the counter-designated temperature side.

Figure 2:
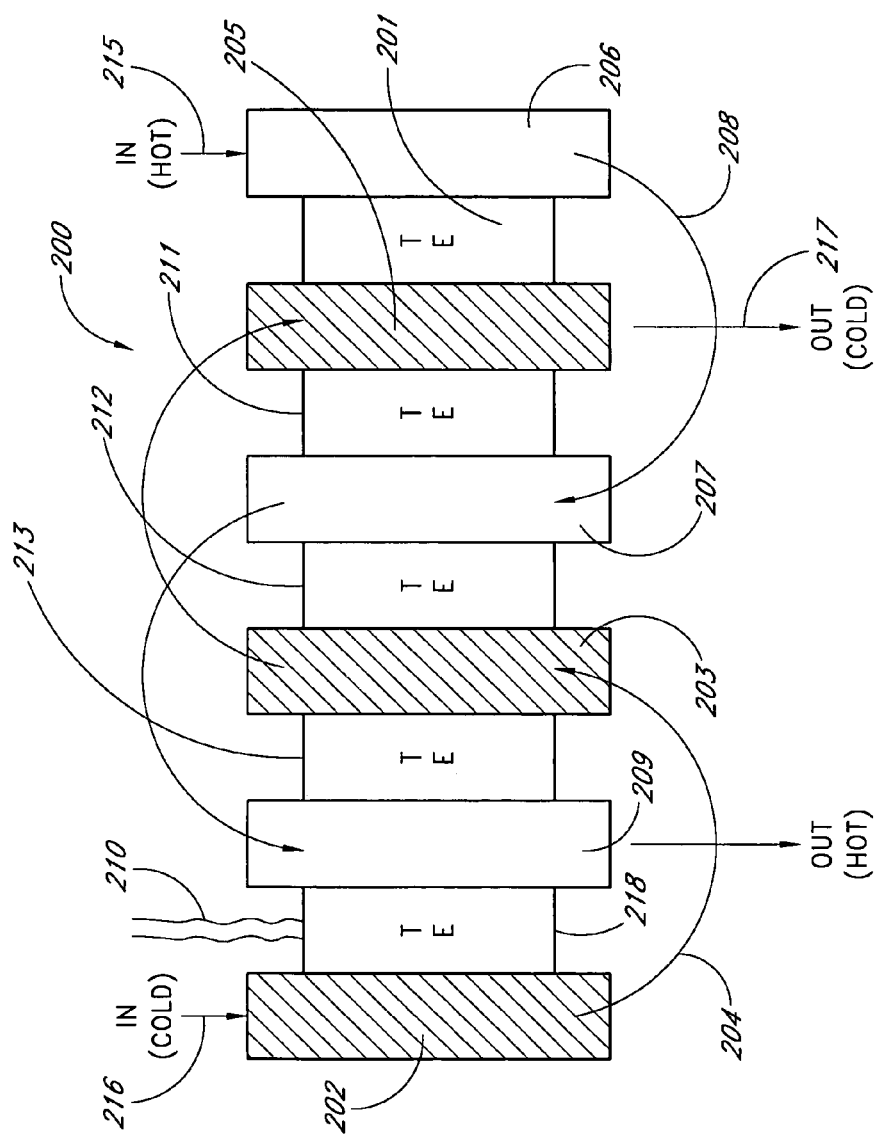
FIG. 2 depicts a general arrangement of a SSCHP system with thermal isolation and counter flow movement of its working media.

FIG. 2 illustrates a first generalized embodiment of an advantageous arrangement for a thermoelectric array 200. The array 200 has a plurality of TE modules 201, 211, 212, 213, 218 in good thermal communication with a plurality of first side heat exchangers 202, 203, 205 and a plurality of second side heat exchangers 206, 207 209. The designation first side heat exchanger and second side heat exchanger does not implicate or suggest that the heat exchangers are on one side or the other side of the entire SSCHP system, but merely that they are in thermal communication with either the colder side or the hotter side of the thermoelectric modules. This is apparent from the figure in that the heat exchangers are actually sandwiched between thermoelectric modules. In that sense, they are in thermal communication with a first side or a second side of the thermoelectric modules. The colder side of a first TE module 201 is in thermal contact with a first side heat exchanger 205 and the hot side of the TE module 201 is in thermal contact with an inlet second side heat exchanger 206. A second working media 215, such as a fluid, enters the array 200 in the upper right hand corner of FIG. 2 through the inlet second side heat exchange 206, and exits near the lower left from a final or outlet second side heat exchanger 209. A first working media 216 enters at the upper left through an inlet first side heat exchanger 202 and exits near the lower right from a final or outlet first side heat exchanger 205. Electrical wires 210 (and similarly for other TE Modules) connected to a power supply, not shown, connect to each TE module 201. First conduits 208, represented as lines on FIG. 2, convey the second working media 215 and second conduits 204 convey the first working media 216 sequentially through various heat exchangers 202, 203, 205, 206, 207 and 209 as depicted.

In operation, the second working media 215 absorbs heat from the TE module 201 as it passes downward through the inlet second side heat exchanger 206. The second working media 215 passes through conduit 208 and upwards into and through the second side heat exchanger 207. In good thermal communication with the heat exchanger 207 are the hotter sides of the TE modules 211 and 212, which have been configured so that their respective hotter sides face toward one another to sandwich the second side heat exchanger 207. The second side working media 215, is further heated as it passes through the second side heat exchanger 207. The second side working media 215 next passes through the second side heat exchanger 209, where again, the hotter sides of the TE modules 213 and 218 sandwich and transfer heat to the second side heat exchanger 209, further heating the second side working media 215. From the heat exchanger 209, the second working media 215 exits the array 200 from the outlet or final second side heat exchange 209.

Similarly, the first working media 216 enters the inlet first side heat exchanger 202 at the upper left corner of FIG. 2. This heat exchanger 202 is in good thermal communication with the colder side of the TE module 218. The first working media 216 is cooled as it passes through the inlet first side heat exchanger 202, on through another first side exchanger 203 and finally through the outlet first side heat exchanger 205, where it exits as colder working media 217.

The thermoelectric cooling and heating is provided by electrical power through wiring 210 into TE module 218, and similarly into all the other TE modules.

Thus, in sum, working media is placed in good thermal contact with the cold side of the TE module at the left hand side of the array, so that heat is extracted from the media. The media then contacts a second and third TE module where additional heat is extracted, further cooling the media. The process of incremental cooling continues, as the media progresses to the right through the desired number of stages. The media exits at the right, after being cooled the appropriate amount. Concurrently, a second media enters the system at the far right and is incrementally heated as it passes through the first stage. It then enters the next stage where it is further heated, and so on. The heat input at a stage is the resultant of the heat extracted from the adjacent TE modules' cold sides, and the electrical power into those modules. The hot side media is progressively heated as it moves in a general right to left direction.

In addition to the geometry described above, the system provides benefit if both media enter at the same temperature and progressively get hotter and colder. Similarly, the media can be removed from or added to the cool or hot side at any location within the array. The arrays can be of any useful number of segments such as 5, 7, 35, 64 and larger numbers of segments.

The system can also be operated by reversing the process with hot and cold media in contact with TE modules, and with the hot and cold media moving from opposite ends (as in FIG. 2 but with the hot media entering as media 216 and the cold media entering as media 215). The temperature gradient so induced across the TE modules produces an electric current and voltage, thus converting thermal power to electrical power. All of these modes of operation and those described in the text that follows are part of the inventions.

As illustrated in FIG. 2, the separation of the heat exchanger into a sequence of stages provides thermal isolation in the direction of flow of the working media from TE module to TE module. U.S. patent application Ser. No. 09/844,818, entitled First Improved Efficiency Thermoelectrics Utilizing Thermal Isolation, filed Apr. 27, 2001 describes in detail the principles of thermal isolation which are exhibited throughout this description with various specific and practical examples for easy manufacturing. This patent application is hereby incorporated by reference in its entirety.

As described in U.S. patent application Ser. No. 09/844,818, entitled Improved Efficiency Thermoelectrics Utilizing Thermal Isolation, the progressive heating and cooling of media in a counter flow configuration as described in FIG. 2, can produce higher thermodynamic efficiency than under the same conditions in a single TE module without the benefit of the thermal isolation. The configuration shown in FIG. 2, thus presents an SSCHP system 200 that obtains thermal isolation through the segments or stages of heat exchangers sandwiched between thermoelectric modules in a compact easily producible design.

In addition to the features mentioned above, the thermoelectric modules themselves may be constructed to provide thermal isolation in the direction of media flow and each heat exchanger or some of the heat exchangers may be configured to provide thermal isolation in a individual heat exchanger through a configuration as will be described further in FIG. 5 or other appropriate configurations. In general, the heat exchanger could be segmented in the direction of flow to provide increased thermal isolation along the flow of a single TE module such as the TE module 218 and the inlet heat exchanger 202.

Figure 3:
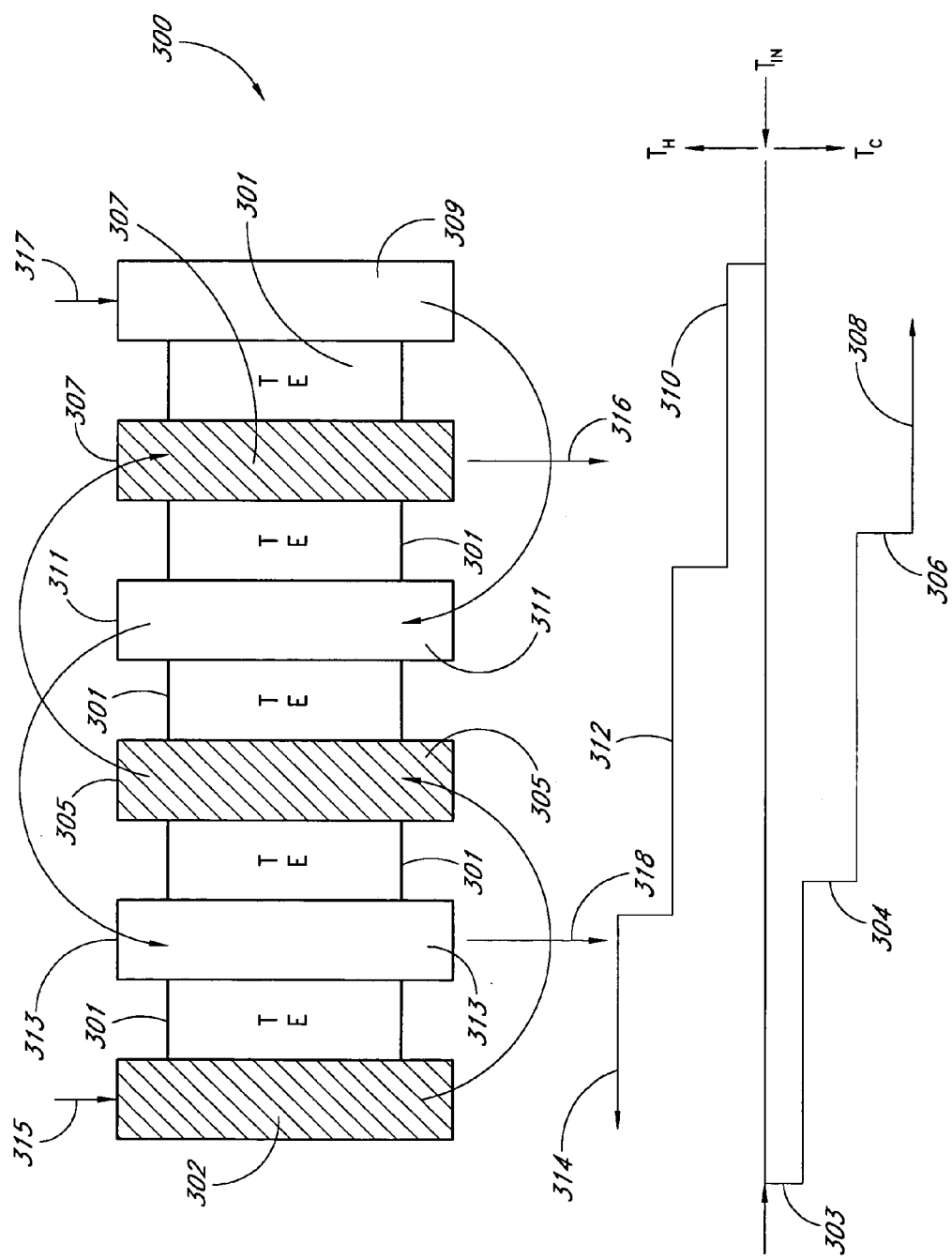
FIG. 3 depicts the temperature changes that occur in the media, as the working media progress through the system.

FIG. 3 depicts an array 300 of the same general design as in FIG. 2, consisting of a plurality of TE modules 301 and colder side heat exchangers 302, 305, and 307 connected so that a first working medium 315 follows the sequential heat exchanger to heat exchanger path shown. Similarly, a plurality of hot side heat exchangers 309, 311 and 313 convey a hotter side working medium 317 in a sequential or staged manner in the direction shown by the arrows. The TE modules 301 are arranged and electrically powered as in the description of FIG. 2.

The lower half of FIG. 3 depicts the cold side temperatures or temperature changes 303, 304, 306, 308 of the colder side working medium and hot side temperatures 310, 312, 314 of the hotter side working medium.

The colder side working medium 315 enters and passes through an inlet colder side heat exchanger 302. The working medium's temperature drop 303 in passing through the inlet colder side heat exchanger 302 is indicated by the drop 303 in the cold side temperature curve Tc. The colder side working medium 315 is further cooled as it passes through the next stage colder side heat exchanger 305, as indicated by a temperature drop 304 and again as it passes through a third colder side heat exchanger 307, with an accompanying temperature drop 306. The colder side working medium 315 exits at colder fluids 316 at temperature 308. Similarly, the hotter side working medium 317 enters a first or inlet hotter side heat exchanger 309 and exits at a first temperature 310 as indicated by the hotter side temperature curve $T_H$ in the FIG. 3. The hotter side working medium progresses through the array 300 in stages as noted in FIG. 2, getting progressively hotter, finally exiting after passing through outlet hotter side heat exchanger 313 as hotter working fluid at 318 and at a hotter temperature 314. It is readily seen that by increasing the number of stages (that is TE modules and heat exchangers) the amount of cooling and heating power can be increased, the temperature change produced by each heat exchanger can be reduced, and/or the amount of media passing through the array increased. As taught in the U.S. patent application Ser. No. 09/844,818, efficiency also can increase with more stages, albeit at a diminishing rate.

Experiments and the descriptions referenced above, show that thermal isolation and the progressive heating and cooling achievable with the configuration of FIGS. 2 and 3 can result in significant efficiency gains, and are therefore important. With such systems, gains of over 100% have been achieved in laboratory tests.

Figures 4A, 4B:
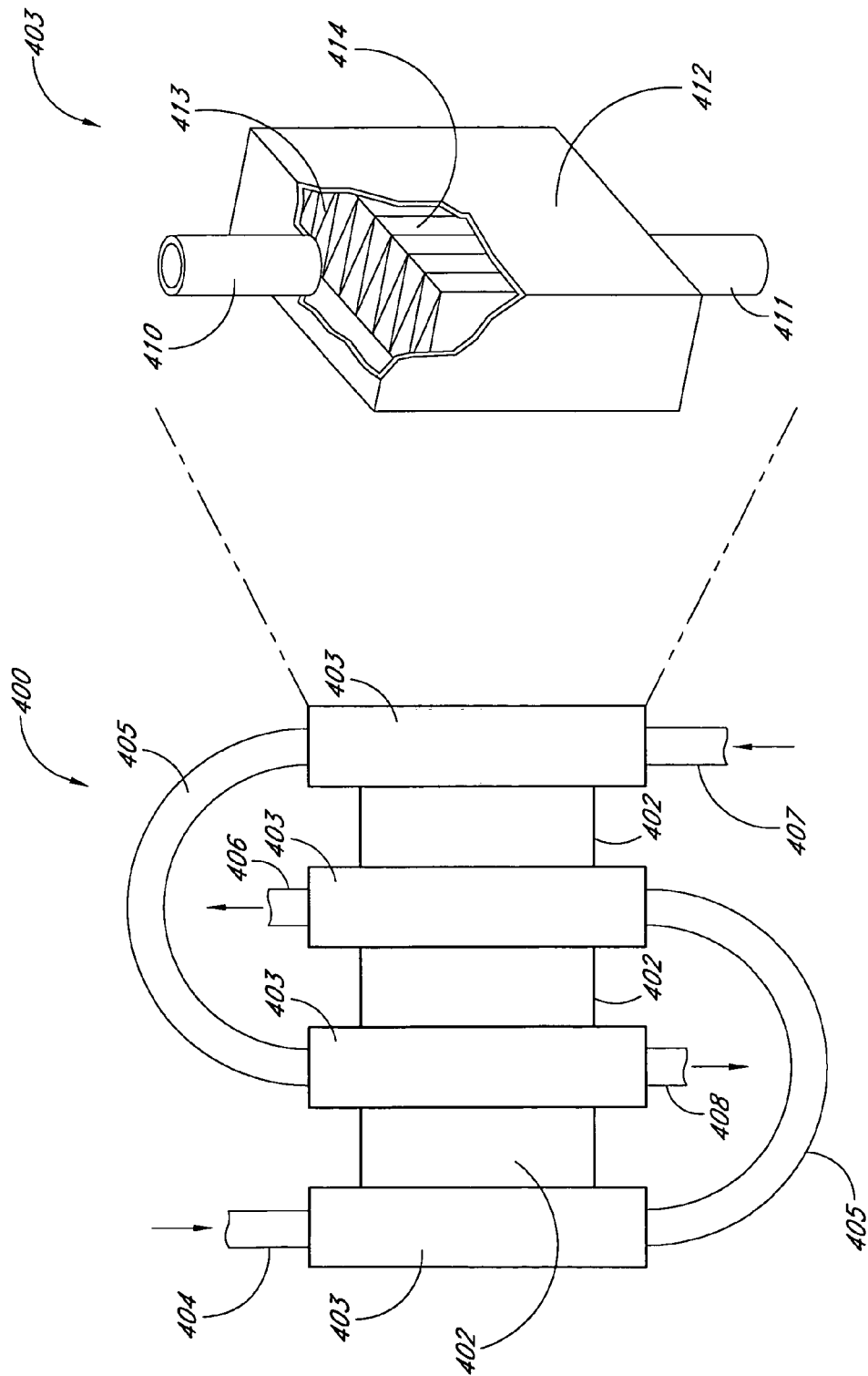
FIG. 4 depicts a system with three TE modules, fin heat exchangers and liquid-working media.

FIG. 4A depicts an array 400 with three TE modules 402, four heat exchangers 403 and two conduits 405 configured as described in FIGS. 2 and 3. Colder and hotter side working fluids enters at a colder side inlet 404 and a hotter side inlet 407, respectively and exit respectively at a colder side exit 406 and a hotter side exit 408. FIG. 4B is a more detailed view of one embodiment of a heat exchanger 403. It is shown as a type suitable for fluid media. The heat exchanger assembly 403, has consists of an outer housing 412 with an inlet 410 and an exit 411, heat exchanger fins 414, and fluid distribution manifolds 413. The operation of array 400 is essentially the same as described in FIGS. 2 and 3. The number of the TE modules 402 is three in FIG. 4, but could be any number. Advantageously, the housing 412 is thermally conductive, being made from a suitable material such as corrosion protected copper or aluminum. In one embodiment, heat exchanger fins 414 advantageously are folded copper, or aluminum soldered or braised to the housing 412, so as to achieve good thermal conductivity across the interface to the TE Module. The Fins 414 can be of any form, but preferably of a design well suited to achieve the heat transfer properties desired for the system. Detailed design guidelines can be found in "Compact Heat Exchangers", Third Edition by W. M. Kays and A. L. London. Alternatively, any other suitable heat exchangers can be used, such as perforated fins, parallel plates, louvered fins, wire mesh and the like. Such configurations are known to the art, and can be used in any of the configurations in any of FIGS. 2 through 11.

FIG. 5A depicts an alternative configuration to that of FIG. 4 for the conduit connections to provide flow from heat exchanger stage to heat exchanger. The array 500 has first and second TE modules 501 and 510, three heat exchangers 502, 503 and 506, and a conduit 504. Of course, as with previous embodiments and configurations, the particular number of two first side heat exchangers 502, 503 and one second side heat exchanger 506 is not restrictive and other numbers could be provided.

FIG. 5B illustrates an enlarged view of a preferred embodiment for the heat exchangers 502, 503, 506. This heat exchanger configuration as shown in FIG. 5B would be appropriate for the other embodiments and can be used in any of the configuration in FIGS. 2-8 and FIG. 11. This advantageous embodiment for one or more of the heat exchangers in such configurations has an outer housing 516 with segmented heat exchanger fins 511 separated by gaps 513. Working fluid enters through an inlet 505 and exits through exit 508. As an alternative to gaps, the heat exchanger could be made so that it is anisotropic such that it is thermally conductive for a section and non-thermally conductive for another section rather than having actual physical gaps between heat exchanger fins. The point is for thermal isolation to be obtained between stages of an individual heat exchanger segment and another individual heat exchanger segment in the direction of flow. This would be thermal isolation provided in addition to the thermal isolation provided by having stages of heat exchangers in the embodiments described in FIGS. 2-5.

Advantageously, a first working fluid fluid 507 which, for example is to be heated, enters an inlet 505 and passes downward through an inlet or first heat exchanger 502 in thermal communication with a first TE module 501. The working fluid 507 exits at the bottom and is conducted to subsequent heat exchanger 503 through conduit 504, where it again passes in a downward direction past a second TE module 510 and exits through as a hotter working 508. Preferably, a second working fluid 517 enters from the bottom of FIG. 5A through inlet 518 and travels upward through a third heat exchanger 506 past the colder sides (in the present example) of TE modules 501 and 510. The heat exchanger 506 is in good thermal communication with the colder sides of the TE modules 501 and 510. By this arrangement, the working fluids 507 and 517 form a counter flow system in accordance with the teaching of U.S. patent application Ser. No. 09/844,818, referenced above.

Preferably, the heat exchangers 502, 503 and 506, shown in detail in FIG. 5B, are constructed to have high thermal conductivity from the faces of the TE modules 501, 510, 510, through the housing 516 and to the heat exchanger fins 511 (depicted in four isolated segments). However, it is desirable to have low thermal conductivity in the direction of flow, so as to thermally isolate each heat exchanger segment from the others. If the isolation is significant, and TE modules 501 and 510 do not exhibit high internal thermal conductivity in their vertical direction (direction of working fluid flow), the array 500 benefits from the thermal isolation and can operate at higher efficiency. In effect, the array 500 can respond as if it were an array constructed of more TE Modules and more heat exchangers.

Figure 6:
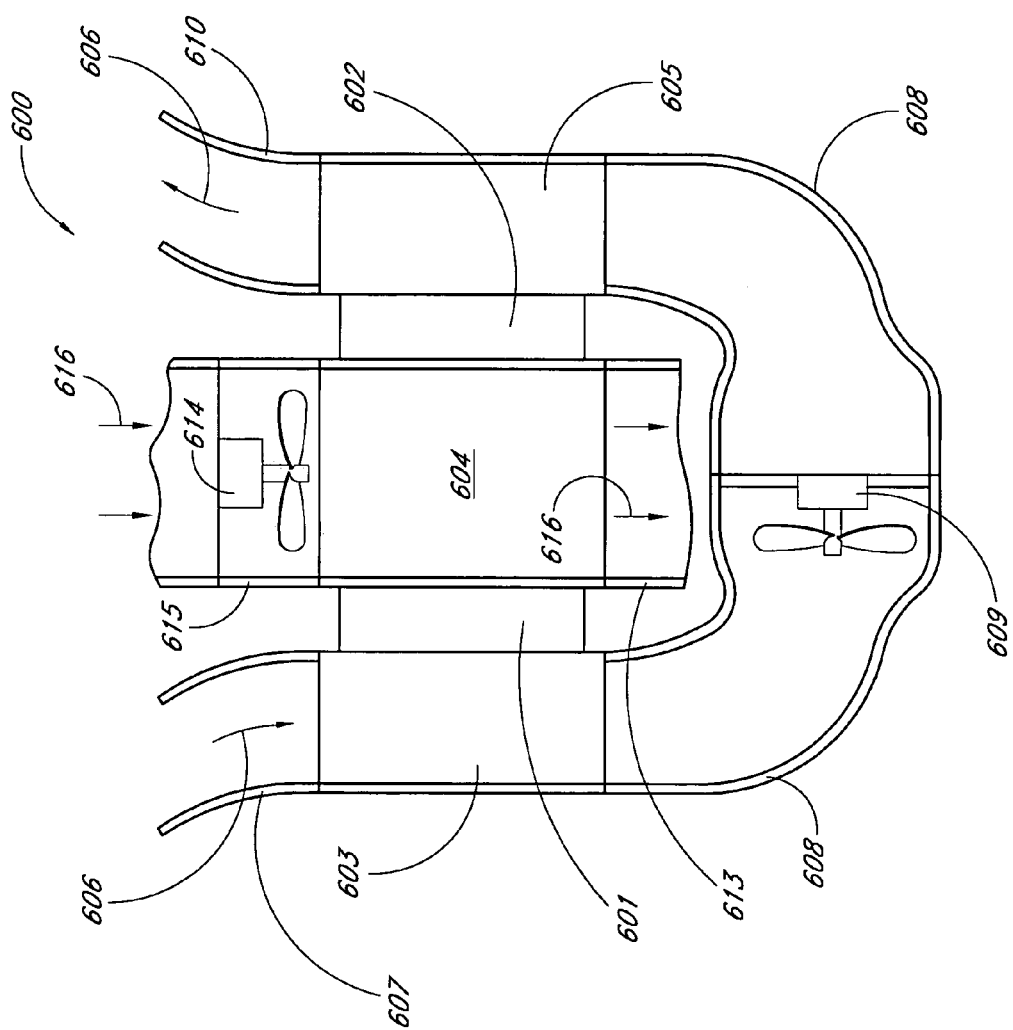
FIG. 6 depicts and gaseous media system with two TE modules and ducted fans to control fluid flow.

FIG. 6 depicts yet another heater/cooler system 600 that is designed to operate beneficially with working gases. The heater/cooler 600 has TE modules 601, 602 in good thermal communication with first side heat exchangers 603, 605 and second side heat exchangers 604. A first working fluid, such as air or other gases 606, is contained by ducts 607, 708, 610 and a second working fluid 616 is contained by ducts 615, 613. Fans or pumps 609, 614 are mounted within ducts 608, 615.

The first working fluid 606 enters the system 600 through an inlet duct 607. The working fluid 606 passes through a first heat exchanger 603 where, for example, it is heated (or cooled). The working fluid 606 then passes through the fan 609 which acts to pump the working fluid 606 through the duct 608, and through the second heat exchanger 605, where it is further heated (or cooled), and out an exit duct 610. Similarly, a working fluid, such as air or another gas, enters through an inlet duct 615. It is pushed by a second fan or pump 614 through a third heat exchanger 604 where, in this example, it is cooled (or heated). The cooled (or heated) working fluid 616 exits through an exit duct 613.

The system 600 can have multiple segments consisting of additional TE modules and heat exchangers and isolated, segmented heat exchangers as described in FIG. 5B. It can also have multiple fans or pumps to provide additional pumping force. In addition, one duct, for example 607, 608, can have one fluid and the other duct 613, 615 a second type of gas. Alternately, one side may have a liquid working fluid and the other a gas. Thus, the system is not restricted to whether a working medium is a fluid or a liquid. Additionally, it should be noted that the exit duct 613 could be routed around the fan duct 609.

FIG. 7A depicts a heating and cooling system 700 for beneficial use with a fluid. The assembly has a plurality of TE modules 701 with a plurality of first side working media 703 and a plurality of second side working media 704. In the present example, both the first side working media 703 and the second side working media 704 form disks. The first side working media 703 are attached to a first side shaft 709, and the second side working media 704 are attached to a second side shaft 708. The shafts 708, 709 are in turn attached to first side motor 706 and second side motor 705, respectively, and to corresponding bearings 707. The preferred direction of motor rotation is indicated by arrows 710 and 711.

A separator 717 both divides the array into two portions and positions the TE modules 701. The TE modules 701, held in position by the separator 717, are spaced so as to alternately sandwich a first side working medium 703 and a second side working medium 704. For any two TE modules 701, the modules are oriented such that their cold sides and hot sides face each other as in the previous embodiments. The working media 703, 704 are in good thermal communication with the TE elements 701. Thermal grease or the like is advantageously provided at the interface between the thermoelectric element 701 and the working media 703, 704. The purpose of the grease becomes apparent in the discussion below regarding the operation of the working media 703, 704. A first side housing section 714 and second side housing section 715 contain fluid conditioned by the system 700. Electrical wires 712, 713 connect to the TE modules 701 to provide drive current for the TE modules.

Figure 7B:
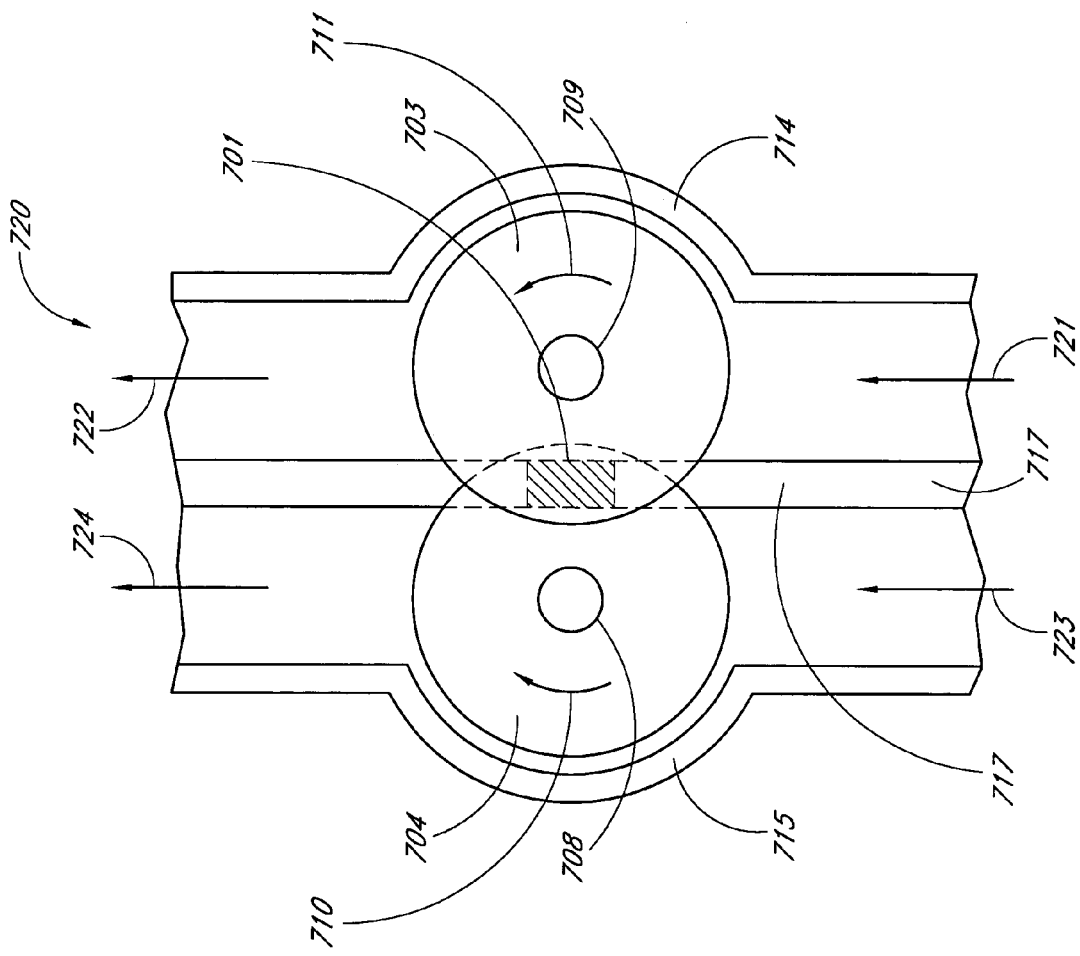
FIG. 7 depicts a solid media system with counter flow to further enhance performance. The TE elements utilize a high length to thickness ratio to achieve added thermal isolation.

FIG. 7B is a cross sectional view 7B-7B through a portion of the system 700 of FIG. 7A. A first fluid 721 and a second fluid 723 are represented along with their direction of flow by arrows 721 and 723. The first fluid exits as represented by the arrow 722 and a second exits as represented by the arrow 724. The system 700 operates by passing current through electrical wires 712 and 713 to TE modules 701. The TE modules 701 have their cold and hot sides facing each other, arranged in the fashion as described in FIGS. 2 and 3. For example, their adjacent cold sides both face the first side working media 703 and their hot sides face the second side working media 704. The Separator 717 serves the dual function of positioning the TE modules 701 and separating the hot side from the cooled side of the array 700.

For an understanding of operation, assume, for example, that a second fluid 723 is to be cooled. The cooling occurs by thermal exchange with second side media 704. As the second side media 704 rotate, the portion of their surface in contact with the colder side of the TE modules 701 at any given time is cooled. As that portion rotates away from the TE modules 701 through the action of the second motor 705, the second media 704 cool the second side fluid that then exits at exit 724. The second fluid is confined within the array 700 by the housing section 715 and the separator 717.

Similarly, the first fluid 721 is heated by the first side media 703 in thermal contact with the hotter side of the TE modules 701. Rotation (indicated by arrow 711) moves the heated portion of first media 703 to where the first fluid 721 can pass through them and be heated via thermal contact. The first fluid 721 is contained between the housing 714 and the separator 717 and exits at exit 722.

As mentioned above, thermally conductive grease or liquid metal such as mercury, can be used to provide good thermal contact between the TE modules 701 and the media 703, 704 at the region of contact.

As mentioned above, the configuration of FIGS. 7A and 7B may also be advantageously used to cool or heat external components such as microprocessors, laser diodes and the like. In such instances, the disks would contact the part using the thermal grease or liquid metal or the like to transfer the heat to or from the part.

FIG. 7C depicts a modified version of the system 700 in which the TE modules 701 are segmented to achieve thermal isolation. FIG. 7C shows a detailed view of the portion of array 700 in which TE modules 701 and 702 transfer thermal power to heat moving media 704 and 703 (the rotating discs in this example). The moving media 704 and 703 rotate about axes 733 and 734, respectively.

In one embodiment, advantageously, the working media 704 and 703 rotate in opposite directions as indicated by arrows 710 and 711. As moving media 704, 703 rotate, heat transfer from different sections of TE modules 701 and 702 come into thermal contact with them and incrementally change the temperature of the moving media 704, 703. For example, a first TE module 726 heats moving medium 704 at a particular location. The material of the moving media 704 at that location moves into contact with a second TE module 725 as a moving medium 704 rotates counter clockwise. The same portion of moving medium 704 then moves on to additional TE module segments 701. The opposite action occurs as a moving medium 703 rotates counterclockwise and engages TE modules 701 and then substantially TE modules 725 and 726.

Advantageously, moving media 704, 703 have good thermal conductivity in the radial and axial directions, and poor thermal conductivity in their angular direction, that is, the direction of motion. With this characteristic, the heat transfer from one TE module 725 to another TE module 726 by conductivity through the moving media 704 and 708 is minimized, thereby achieving effective thermal isolation.

As an alternative to TE modules or segments 701, 725, 726, a single TE element or several TE element segments may be substituted. In this case, if the TE elements 701 are very thin compared to their length in the direction of motion of moving media 704, 703, and have relatively poor thermal conductivity in that direction, they will exhibit effective thermal isolation over their length. They will conduct heat and thus respond thermally as if they were constructed of separate TE modules 701. This characteristic in combination with low thermal conductivity in the direction of motion within the moving media 704, 703 can achieve effective thermal isolation and thereby provides performance enhancements.

FIG. 7D depicts an alternative configuration for moving media 704, 703 in which the media are constructed in the shape of wheels 729 and 732 with spokes 727 and 731. In the spaces between spokes 727 and 731 and in good thermal contact with them, are heat exchanger material 728 and 730.

The system 700 can operate in yet another mode that is depicted in FIG. 7D. In this configuration, working fluid (not shown) moves axially along the axes of the array 700 passing through moving media 704, 703 sequentially from one medium 704 to the next moving medium 704, and so on in an axial direction until it passes through the last medium 704 and exits. Similarly, a separate working fluid, not shown, passes through individual moving medium 703 axially through array 700. In this configuration, the ducts 714 and 715 and separator 717 are shaped to form a continuous ring surrounding moving media 704, 703 and separating medium 704 from medium 703.

As the working fluid flows axially, thermal power is transferred to the working fluid through heat exchanger material 728 and 730. Advantageously, the hot side working fluid, for example, passes through heat exchanger 728, moves through the array 700 in the opposite direction of the working fluid moving through heat exchanger 730. In this mode of operation, the array 700 acts as a counterflow heat exchanger, and a succession of sequential heat exchangers 728 and 730 incrementally heat and cool the respective working fluids that pass through them. As described for FIG. 7C, the thermally active components can be TE modules 701 that can be constructed so as to have effective thermal isolation in the direction of motion of the moving media 704, 703. Alternatively, the TE modules 701 and 702 can be segments as described in FIG. 7C. In the latter case, it is further advantageous for the thermal conductivity of the moving media 704, 703 to be low in the direction of motion so as to thermally isolate portions of the outer discs 729 and 732 of the moving media 704, 703.

Alternately, the design could be further contain radial slots (not shown) in the sections 729 and 732 that are subject to heat transfer from TE modules 701 and 702 to achieve thermal isolation in the direction of motion.

Figure 8:
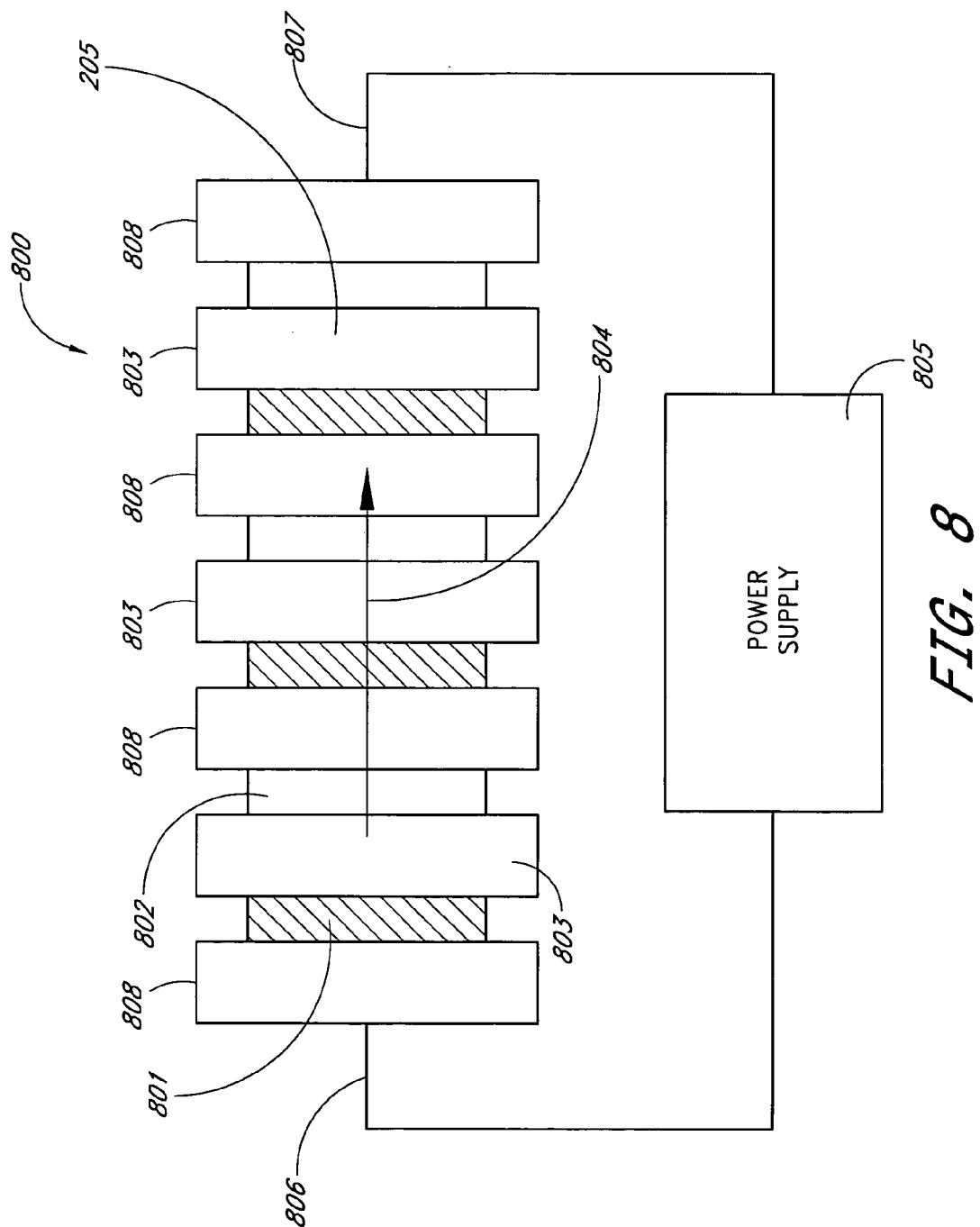
FIG. 8 depicts a system with TE elements arranged so that current passes directly through the array and thereby lowers cost, weight and size while providing improved performance.

FIG. 8 depicts another embodiment of a thermoelectric system an 800 having a plurality of TE elements 801 (hatched) and 802 (unhatched) between first side heat exchangers 803 and second side heat exchangers 808. A power supply 805 provides current 804 and is connected to heat exchangers 808 via wires 806, 807. The system 800 has conduits and pumps or fans (not shown) to move hot and cold side working media through the array 800 as described, for example, in FIGS. 2, 3, 4, 5, 6 and 7.

Figure 1A:
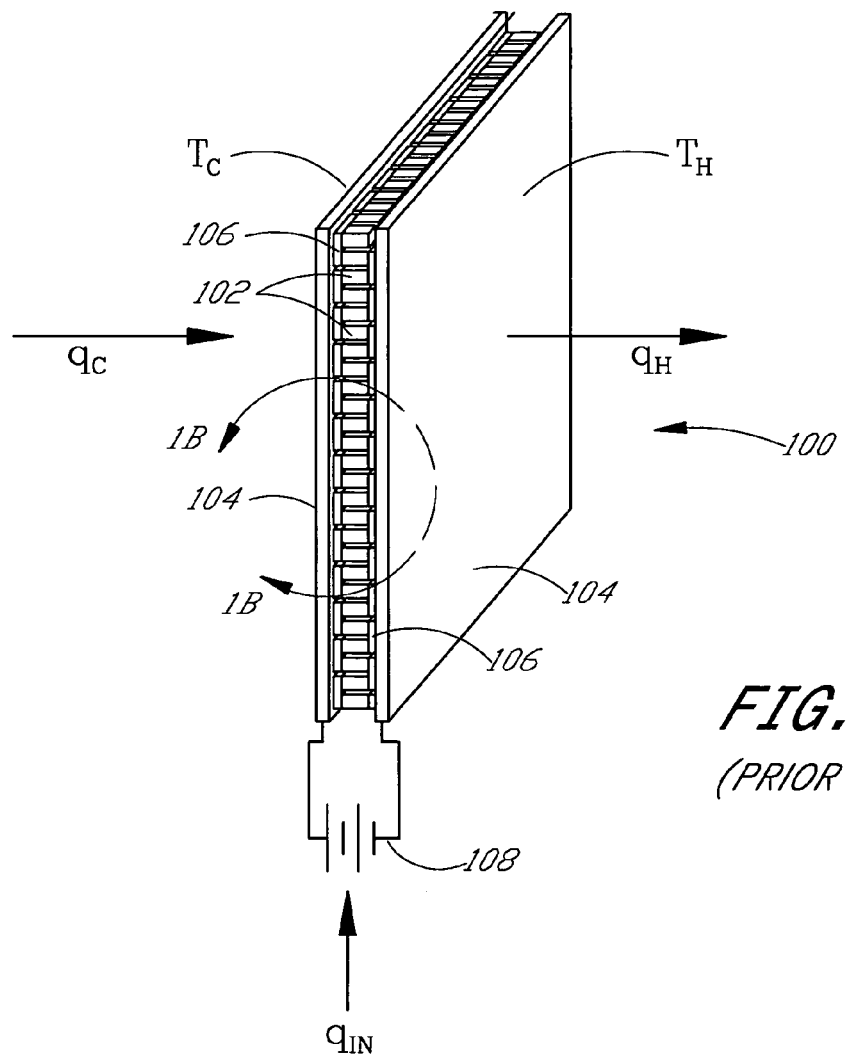
FIG. 1 depicts a conventional TE module.
Figure 1B:
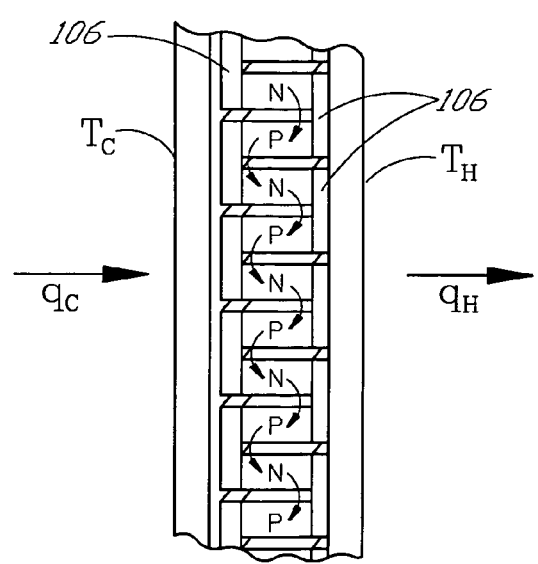

In this design, the TE modules (having many TE elements) are replaced by TE elements 801 and 802. For example, hatched TE elements 801 may be N-type TE elements and unhatched TE elements 802 may be P-type TE elements. For this design, it is advantageous to configure heat exchangers 803 and 808 so that they have very high electrical conductivity. For example, the housing of the heat exchangers 803, 808 and their internal fins or other types of heat exchanger members can be made of copper or other highly thermal and electrical conductive material. Alternately, the heat exchangers 803 and 808 can be in very good thermal communication with the TE elements 801 and 802, but electrically isolated. In which case, electrical shunts (not shown) can be connected to the faces of TE elements 801 and 802 to electrically connect them in a fashion similar to that shown in FIG. 1, but with the shunts looped past heat exchangers 803 and 808.

Regardless of the configuration, DC current 804 passing from N-type 801 to P-type TE elements 802 will, for example, cool the first side heat exchanger 803 sandwiched between them, and current 804 passing from P-type TE elements 802 to N-type TE elements 801 will then heat the second side heat exchanger 808 sandwiched between them.

The Array 800 can exhibit minimal size and thermal losses since the shunts, substrates and multiple electric connector wires of standard TE modules can be eliminated or reduced. Further, TE elements 801 and 802 can be hetrostructures that accommodate high currents if the components are designed to have high electrical conductivity and capacity. In such a configuration, the array 800 can produce high thermal power densities.

Figure 9:
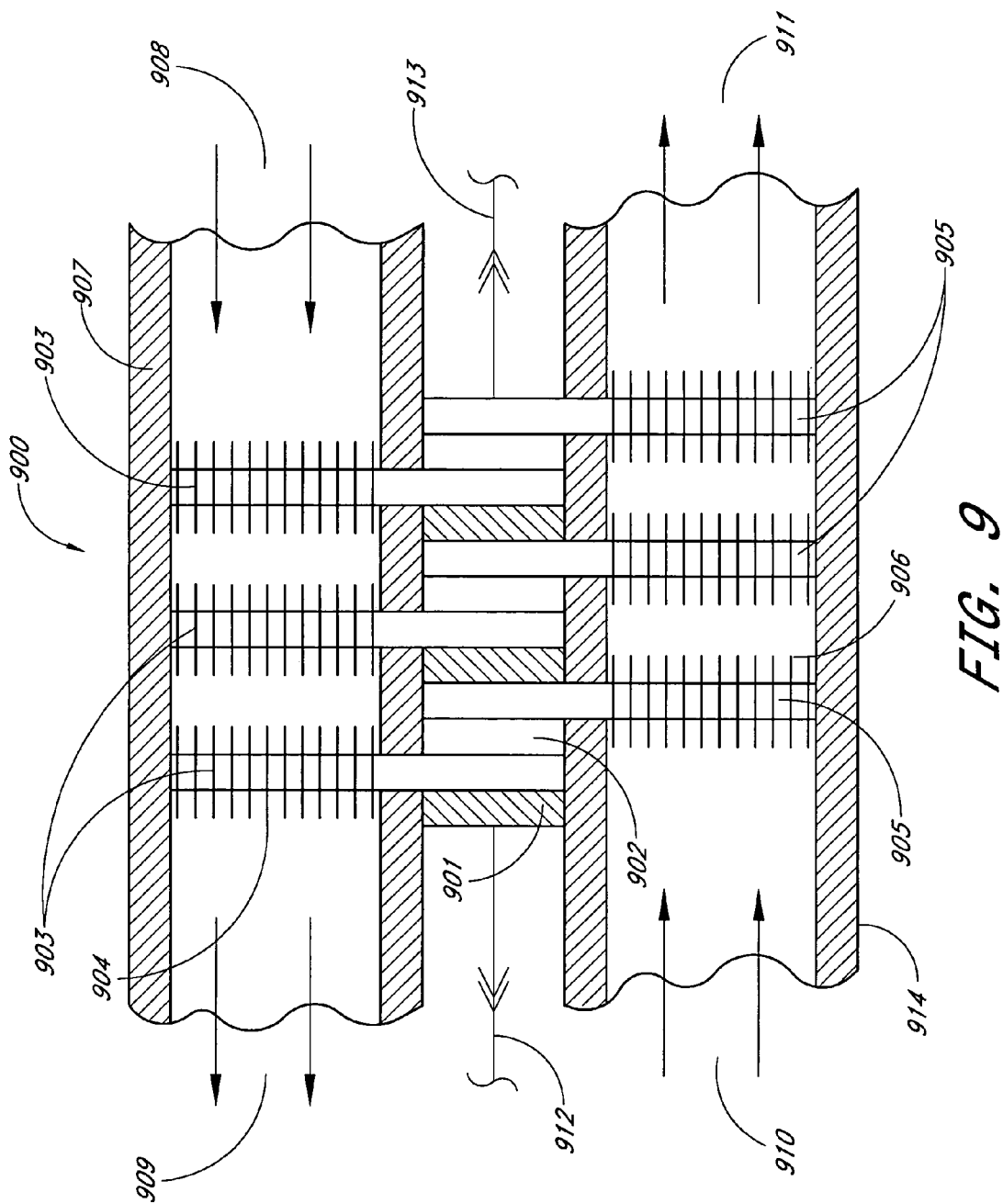
FIG. 9 depicts a system with TE elements, heat pipes and heat exchangers that is simple and low cost. The hot side and cold side are separated by thermal transport through heat pipes.

FIG. 9 depicts a thermoelectric system 900 of the same general type as described in FIG. 8, with P-type TE elements 901 and N-type TE elements 902 between, and in good thermal contact with first side heat transfer members 903 and second side heat transfer members 905. In this configuration, the heat transfer members 903 and 905 have the form of thermally conductive rods or heat pipes. Attached to, and in good thermal communication with the heat transfer members 903 and 905 are heat exchanger fins 904, 906, or the like. A first conduit 907 confines the flow of a first working medium 908 and 909 and a second conduit 914 confines the flow of a second working fluid 910 and 911. Electrical connectors 912 and 913 conduct current to the stack of alternating P-type and N-type TE elements 901, 902, as described in FIG. 8.

In operation, by way of example, current enters the array 900 through the first connector 912, passes through the alternating P-type TE elements 901 (hatched) and N-type TE elements 902 (unhatched) and exits through the second electrical connector 913. In the process, the first working media 908 becomes progressively hotter as it is heated by conduction from heat transfer fins 904, which in turn have been heated by conduction through the first heat transfer members 903. The first conduit 907 surrounds and confines a first working media 908 exits at a changed temperature as working fluid 909. Portions of the first conduit 907 thermally insulate the TE elements 901 and 902 and the second side heat transfer members 905 from the first (hot in this case) working media 908 and 909. Similarly, the second working media 910 enters through the second conduit 914, is cooled (in this example) as it passes through the second side heat exchangers 906 and exits as cooled fluid 911. The TE elements 901, 902 provide cooling to the second side heat transfer members 905 and hence, to heat exchanger fins 906. The second side conduit 914 acts to confine the second (cooled in this example) working media 910, and to insulate it from other parts of array 900.

Although described for individual TE elements in the embodiments of FIGS. 8-9, TE modules may be substituted for the TE elements 901, 902. In addition, in certain circumstances, it may be advantageous to electrically isolate TE elements 901, 902 from the heat transfer members 903, 905, and pass current through shunts (not shown). Also, the heat exchangers 904, 906 can be of any design that is advantageous to the function of the system. As with the other embodiments, it is seen that the configurations of FIGS. 8 and 9 provide a relatively easily manufacturable system that also provides enhanced efficiency from thermal isolation. For example, in FIG. 8, the heat exchangers 808, 803 which alternate between P-type and N-type thermal electric elements, will either be of the colder or hotter heat exchanger type, but will be reasonably thermally isolated from each other and cause the thermoelectric elements of the P and N type to be reasonably thermally isolated from one another.

Figure 10:
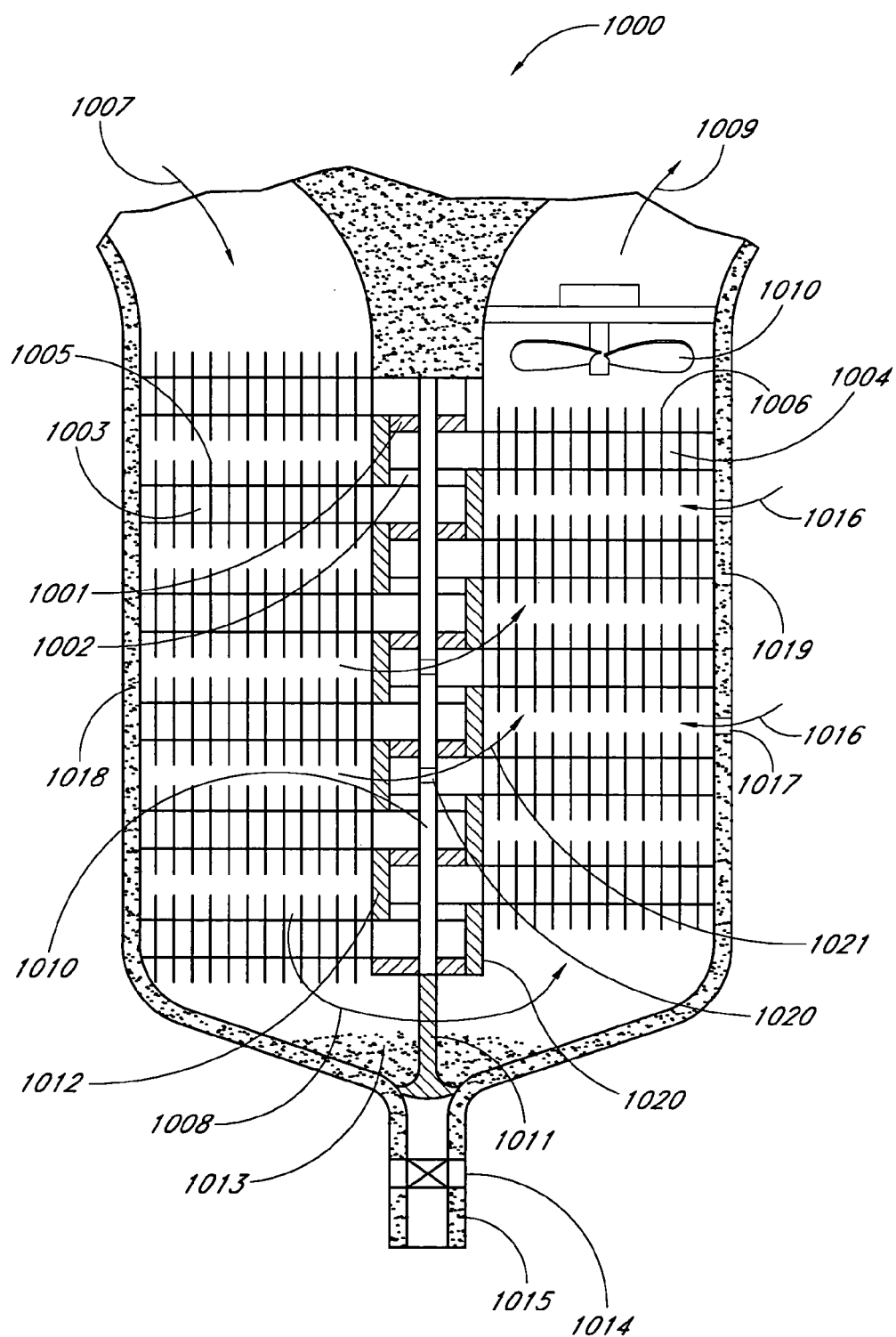
FIG. 10 depicts a fluid system in which the fluid is pumped through the heat exchanger and TE module array so as to achieve a low temperature at one end to condense moisture out of a gas or a precipitate from a liquid or gas. The system has provisions to shunt working fluid flow to improve efficiency by lowering the temperature differential across portions of the array.

FIG. 10 depicts another thermoelectric array system (1000) that provides thermal isolation. Advantageously, this configuration may perform the function of a system that utilizes cooling and heating of the same medium to dehumidify, or remove precipitates, mist, condensable vapors, reaction products and the like and return the medium to somewhat above its original temperature.

The system 1000 consists of a stack of alternating P-type TE elements 1001 and N-type TE elements 1002 with interspersed cold side heat transfer elements 1003 and hot side heat transfer elements 1004. In the depicted embodiment, heat exchanger fins 1005, 1006 are provided for both the colder side heat transfer elements 1003 and the hotter side heat transfer elements 1004. A colder side conduit 1018 hotter side conduit 1019 direct working fluid 1007, 1008 and 1009 within the array 1000. A fan 1010 pulls the working fluid 1007, 1008 and 1009 through the array 1000. Preferably, colder side insulation 1012 thermally isolates the working fluid 1007 while travelling through the colder side from the TE element stack and hotter side insulation 1020 preferably isolates the working fluid while travelling through the hotter side from the TE element stack. A baffle 1010 or the like separates the colder and hotter sides. In one preferred embodiment, the baffle 1010 has passages 1010 for working fluids 1021 to pass through. Similarly, in one embodiment, fluid passages 1017 allow fluid 1016 to enter the hot side flow passage.

A screen 1011 or other porous working fluid flow restrictor separates the colder from the hotter side of array 1000. Condensate, solid precipitate, liquids and the like 1013 accumulate at the bottom of the array 1000, and can pass through a valve 1014 and out a spout 1015.

Current flow (not shown) through TE elements 1001 and 1002, cools colder side heat transfer elements 1003 and heats hotter side heat transfer elements 1004, as discussed in the description of FIG. 9. In operation, as the working fluid 1007 passes down the colder side, precipitate, moisture or other condensate 1013 from the working fluid 1007 can collect at the bottom of the array 1000. As required, the valve 1014 can be opened and the precipitate, moisture or condensate 1013 can be removed through the spout 1015 or extracted by any other suitable means.

Advantageously, some of the working fluid 1021 can be passed from the colder to the hotter side through bypass passages 1020. With this design, not all of the colder side fluid 1007 passes through the flow restrictor 1011, but instead can be used to reduce locally the temperature of the hotter side working fluid, and thereby improve the thermodynamic efficiency of the array 1000 under some circumstances. Proper proportioning of flow between bypass passages 1020 and flow restrictor 1011, is achieved by suitable design of the flow properties of the system. For example, valves can be incorporated to control flow and specific passages can be opened or shut off. In some uses, the flow restrictor 1011 may also act as a filter to remove precipitates from liquid or gaseous working fluids 1008, or mist or fog from gaseous working fluids 1008.

Advantageously, additional hotter side coolant 1016 can enter array 1000 through side passages 1017, also for the purpose of reducing the hotter side working fluid temperature or increasing array 1000 efficiency.

This configuration can produce very cold conditions at the flow restrictor 1011, so that working fluid 1008 can have substantial amounts of precipitate, condensate or moisture removal capability. In an alternative mode of operation, power to the fan 1010 can be reversed and the system operated so as to heat the working fluid and return it to a cool state. This can be advantageous for removing reaction products, precipitates, condensates, moisture and the like that is formed by the heating process. In one advantageous embodiment, flow restrictor 1011, and/or heat exchangers 1005 and 1006 can have catalytic properties to enhance, modify, enable, prevent or otherwise affect processes that could occur in the system. For liquid working fluids, one or more pumps can replace fan/motor 1010 to achieve advantageous performance.

Figure 11:
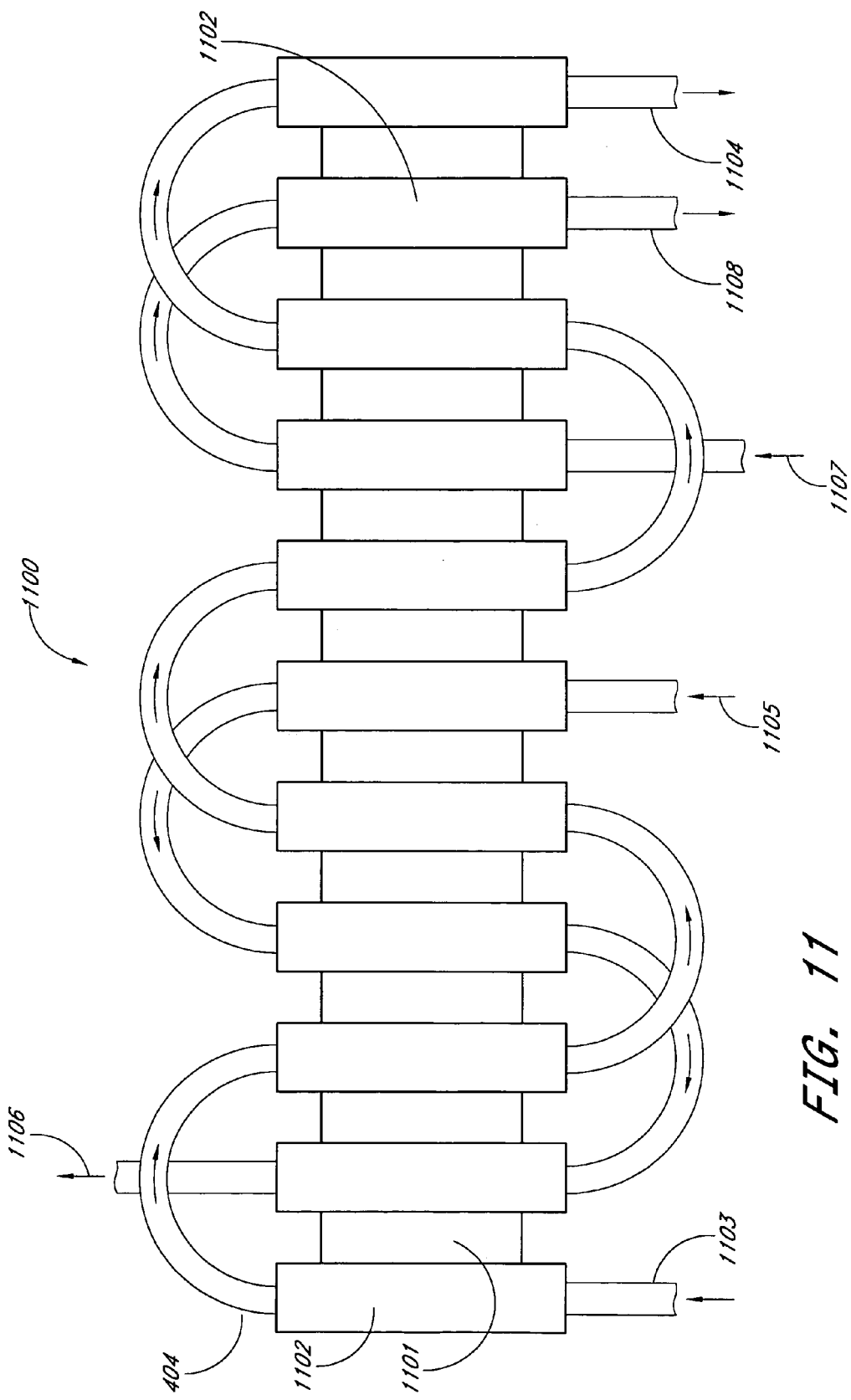
FIG. 11 depicts an array in which working fluid enters and exits at a variety of locations, and in which part of the system operates in counter flow and part in parallel flow modes.

FIG. 11 depicts a thermoelectric array 1100 similar in design to that of FIGS. 2 and 3, but in which working media has alternate paths through the system. The array 1100 has TE modules 1101 interdispersed between heat exchangers 1102. A plurality of inlet ports 1103, 1105 and 1107 conduct working media through the array 1100. A plurality of exit ports 1104, 1106 and 1108 conduct working media from the array 1100.

In operation, by way of example, working media to be cooled enters at a first inlet port 1103 and passes through several of the heat exchangers 1102, thereby progressively cooling (in this example), and exits through a first exit port 1104. A portion of the working media that removes heat from array 1100 enters through a second inlet port 1105, passes through heat exchangers 1102, is progressively heated in the process, and exits through a second exit port 1106.

A second portion of working media to remove heat enters a third inlet port 1107, is heated as it passes through some of the heat exchangers 1102 and exits through a third exit port 1108.

This design allows the cool side working media which passes from the first inlet port 1103 to the first exit port 1104 to be efficiently cooled, since the hot side working media enters at two locations in this example, and the resultant temperature differential across the TE modules 1101 can be on average lower than if working media entered at a single port. If the average temperature gradient is lower on average, then under most circumstances, the resultant system efficiency will be higher. The relative flow rates through the second and third inlet port 1105 and 1107 can be adjusted to achieve desired performance or to respond to changing external conditions. By way of example, higher flow rates through the third inlet port 1107, and most effectively, a reversal of the direction of flow through that portion so that third exit port 1108 is the inlet, can produce colder outlet temperatures in the cold side working media that exits at first exit port 1104. All of these variations.

It should also be noted that the features described above may be combined, without departing from the invention.

The above examples have been discussed in terms of cooling and heating of working media by applying power to TE elements and modules. The reverse process of extracting electrical power by applying temperature gradients across the TE elements and modules is well known to the art. In particular, the configuration shown in FIGS. 2, 3, 4, 5, 6, 7, 8, 9 and 11 lend themselves to power generation.

In general, the systems described in these figures do operate in both modes. Advantageously, specific changes can be implemented to optimize performance for cooling, heating or power generation. For example, large temperature differentials (200 to 2000° F.) are desirable to achieve high-efficiency in power generation as is well know in the art, while small temperature differentials (10 to 60° F.) are characteristic of cooling and heating systems. Large temperature differentials require different construction materials and possibly TE modules and elements of different design and materials. Nevertheless, the basic concept remains the same for the different modes of operation. The designs described in FIGS. 5, 8 and 9 are advantageous for power generation because they offer the potential to be simple, rugged, low-cost design and fabrication. However, all of the above mentioned designs can have merit for specific power generation applications and cannot be excluded.

Although several examples have been illustrated, as discussed above, the description above is merely illustrative of broad concepts of the inventions, which are set forth in the attached claims. In the claims, all terms are attributed to their ordinary and accustomed meaning and the description above does not restrict the terms to any special or specifically defined means unless specifically articulated.

What is claimed is:

1. An improved thermoelectric system comprising:
   a plurality of thermoelectric modules, at least some of which are substantially thermally isolated from each other, each module having a hotter side and a colder side; and
   at least one solid movable working medium in thermal communication with at least two of the plurality of thermoelectric modules in sequence, such that the working medium is progressively cooled or heated in stages by at least two of the plurality of thermoelectric modules, the working medium movable relative to at least two of the plurality of thermoelectric modules as the working medium is cooled or heated.

2. The thermoelectric system of claim 1, wherein the working medium comprises a plurality of disk-like media mounted to a rotating shaft, and said media form a stacked configuration with the thermoelectric modules sandwiching at least some of the disk-like media.

3. The thermoelectric system of claim 1, wherein the working medium comprises a plurality of working media forming an alternating stacked configuration of thermoelectric modules and working media.

4. The thermoelectric system of claim 3, wherein the working media substantially thermally isolate at least some of the plurality of thermoelectric modules.

5. An improved thermoelectric system comprising:
   a plurality of thermoelectric modules, at least some of which are substantially thermally isolated from each other, the plurality of thermoelectric modules comprising at least one N-type thermoelectric element and at least one P-type thermoelectric element, each thermoelectric module having a hotter side and a colder side; and
   a plurality of heat transfer devices, at least some of which are in different planes and in thermal communication with at least one of the plurality of thermoelectric modules, at least two of the heat transfer devices fluidly coupled together and accepting a first working fluid that flows sequentially through the at least two heat transfer devices, wherein the first working fluid is cooled or heated in stages as it flows through the at least two heat transfer devices.

6. The thermoelectric system of claim 5, wherein each of at least some of the heat transfer devices are sandwiched between at least two thermoelectric modules.

7. The thermoelectric system of claim 6, wherein at least one of the plurality of thermoelectric modules has its cooler side facing a sandwiched heat transfer device.

8. The thermoelectric system of claim 5, wherein the thermoelectric modules and heat transfer devices form a stack, with the cooler sides of at least some of the thermoelectric modules generally facing one another, separated by at least one heat transfer device, and the hotter sides of at least some of the thermoelectric modules generally facing one another, separated by at least one heat transfer device.

9. The thermoelectric system of claim 5, wherein the heat transfer devices are heat exchangers comprising a housing and heat exchanger fins, the heat exchanger fins of a heat exchanger forming stages in the direction of the working fluid flow, so as to provide additional thermal isolation for at least one of the thermoelectric modules in thermal communication with the heat exchanger.

10. The thermoelectric system of claim 5, wherein the first working fluid flows in the same direction through each of the cooling heat transfer devices.

11. The thermoelectric system of claim 8, wherein the heat transfer devices accept a working fluid to flow through them in a defined direction.

12. The thermoelectric system of claim 11, wherein the heat transfer devices are heat exchangers comprising a housing with heat exchanger elements inside formed in segments, and wherein at least one of the segments is substantially thermally isolated from at least one other of the segments.

13. The thermoelectric system of claim 12, further comprising at least one conduit providing a fluid path from a first heat exchanger to a second heat exchanger, such that working fluid travelling through the first heat exchanger and the second heat exchanger is cooled or heated in stages.

* * * * *

UNITED STATES PATENT AND TRADEMARK OFFICE
CERTIFICATE OF CORRECTION

| | | |
|---|---|---|
| PATENT NO. | : 7,231,772 B2 | Page 1 of 1 |
| APPLICATION NO. | : 10/227398 | |
| DATED | : June 19, 2007 | |
| INVENTOR(S) | : Lon E. Bell | |

It is certified that error appears in the above-identified patent and that said Letters Patent is hereby corrected as shown below:

Title Page; item (56);

On Page 1, Col. 2 (Other Publications), Line 1, after "Module" insert -- Using --.

On Page 2, Col. 2 (Other Publications), Line 29, delete "Thermodynamie", and insert -- Thermodynamic --, therefor.

Col. 2, line 8-9, delete "manufactureable", and insert -- manufacturable --, therefor.

Col. 10, line 60, delete "substantially", and insert -- subsequently --, therefor.

Col. 12, line 51, after "908," insert -- so it --.

Col. 13, line 28, before "hotter," insert -- and a --.

Signed and Sealed this
Twenty-fourth Day of May, 2011

David J. Kappos
*Director of the United States Patent and Trademark Office*